US007107562B2

(12) United States Patent
Schröder et al.

(10) Patent No.: US 7,107,562 B2
(45) Date of Patent: Sep. 12, 2006

(54) METHOD AND APPARATUS FOR THE ARRANGEMENT OF CONTACT-MAKING ELEMENTS OF COMPONENTS OF AN INTEGRATED CIRCUIT, COMPUTER-READABLE STORAGE MEDIUM AND PROGRAM ELEMENT

(75) Inventors: Paul Schröder, Lake Carmel, NY (US); Tobias Mono, Dresden (DE)

(73) Assignee: Infineon Technologies AG, (DE)

( * ) Notice: Subject to any disclaimer, the term of this patent is extended or adjusted under 35 U.S.C. 154(b) by 323 days.

(21) Appl. No.: 10/719,005

(22) Filed: Nov. 21, 2003

(65) Prior Publication Data

US 2005/0083083 A1  Apr. 21, 2005

(30) Foreign Application Priority Data

Nov. 28, 2002  (DE) ................. 102 55 626

(51) Int. Cl.
*G06F 17/50* (2006.01)
(52) U.S. Cl. ............... 716/11; 716/1; 716/9; 716/12
(58) Field of Classification Search ............. 716/1, 716/9, 11, 12; 436/311; 361/774
See application file for complete search history.

(56) References Cited

U.S. PATENT DOCUMENTS 5,592,083 A  1/1997  Magnuson et al.
5,691,115 A *  11/1997  Okamoto et al. ........... 430/311
6,215,670 B1 *  4/2001  Khandros .................... 361/774
2001/0024758 A1  9/2001  Kuji et al.

FOREIGN PATENT DOCUMENTS

DE  101 26 130 A1  12/2002

* cited by examiner

*Primary Examiner*—Thuan Do
(74) *Attorney, Agent, or Firm*—Brinks Hofer Gilson & Lione

(57) ABSTRACT

The invention relates to a method and an apparatus for the arrangement of contact-making elements of components of an integrated circuit, a computer-readable storage medium and a program element. In the method for the arrangement of contact-making elements of components of an integrated circuit, at least one part of at least one component having a larger extent along a first course direction than along a second course direction, which is orthogonal to the first course direction, and at least one contact-making element assigned to a component having, in cross section, a larger extent along a third course direction than along a fourth course direction, which is orthogonal to the third course direction, the contact-making element is arranged with respect to the assigned component in such a way that the first course direction of the component essentially runs parallel to the third course direction of the contact-making element.

15 Claims, 4 Drawing Sheets

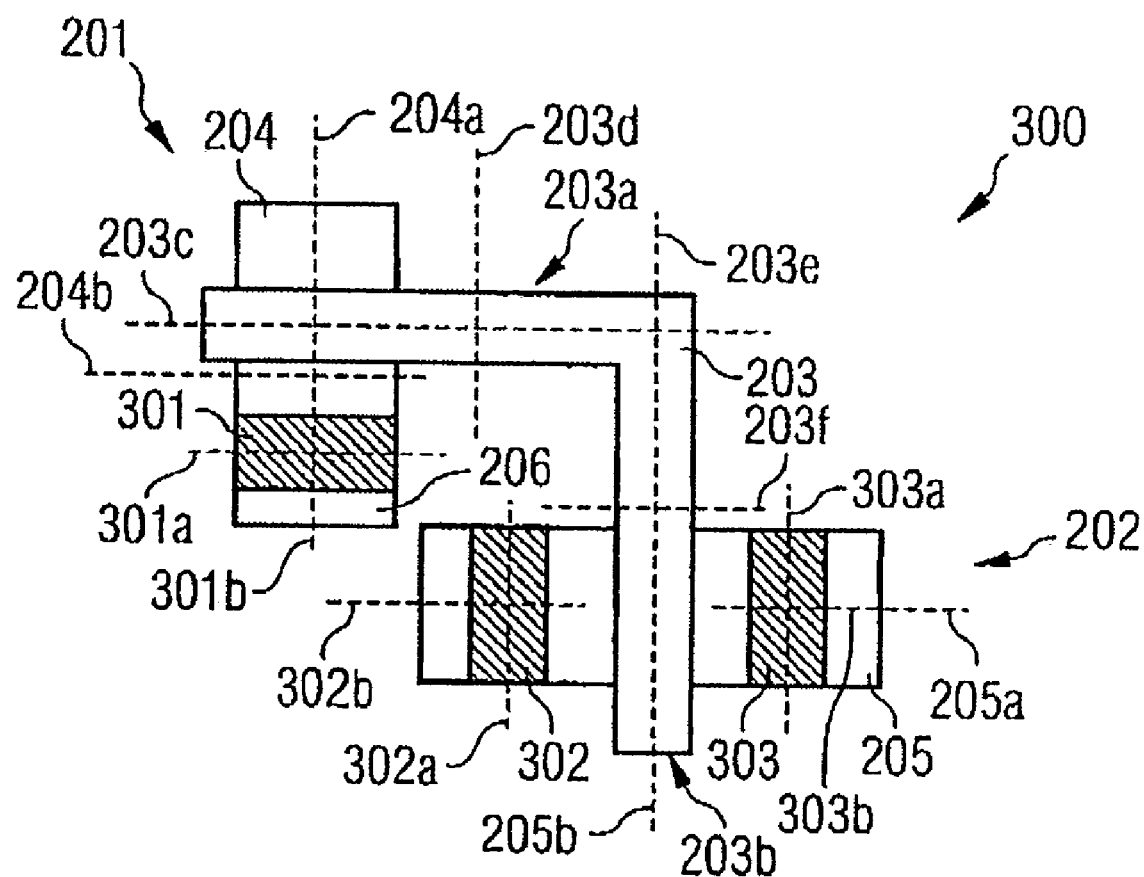

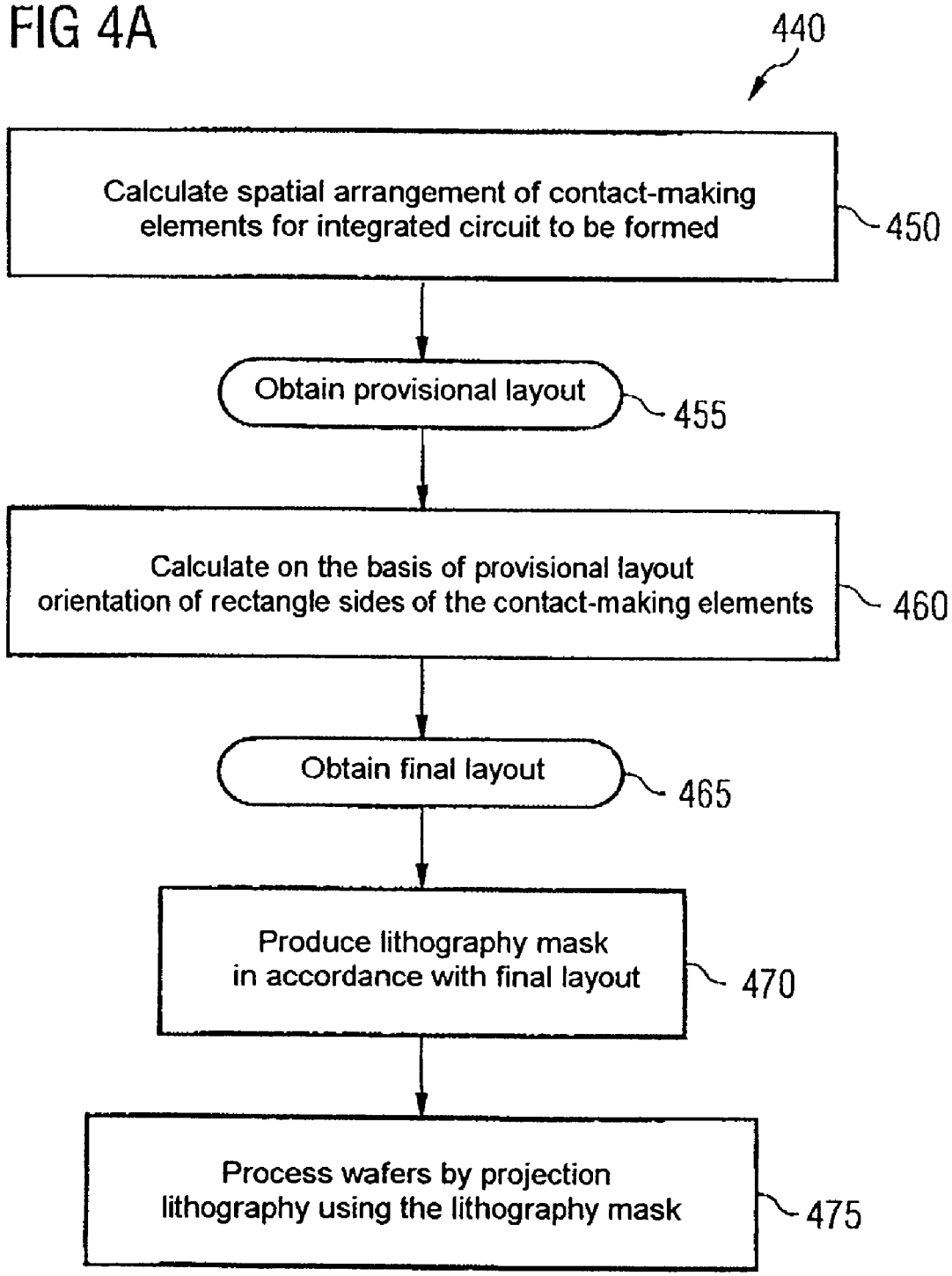

METHOD AND APPARATUS FOR THE ARRANGEMENT OF CONTACT-MAKING ELEMENTS OF COMPONENTS OF AN INTEGRATED CIRCUIT, COMPUTER-READABLE STORAGE MEDIUM AND PROGRAM ELEMENT

The invention relates to a method and an apparatus for the arrangement of contact-making elements of components of an integrated circuit, a computer-readable storage medium and a program element.

Further advancing miniaturization in silicon microelectronics is also accompanied by an increase in the requirements made of lithography methods used in this context.

The task of a lithography method is to produce a multiplicity of resist structures on a silicon wafer in dimensionally true, positionally correct and defect-free fashion. Criteria for the performance of a lithography method are the minimum feature size that can be achieved, the line width variation, the positional error variation and also the defect density. The minimum structural dimension that can be achieved ("critical dimension", CD), in particular, is essential with regard to a high integration density desired.

A lithography mask is used, inter alia, for making electrical contact with an arrangement of processed integrated components of a silicon chip. For this purpose, a component with which contact is to be made is electrically coupled to an electrically conductive contact-making element, the contact-making element often having a square cross section. As the structural dimension of an integrated circuit is reduced, the side length of the contact-making element is also scaled to ever smaller dimensions, a reduction of a side length of a square contact-making element being incorporated quadratically into a reduction of the cross-sectional area.

For this reason, contact-making elements with a rectangular cross-sectional area are often used in particular in the case of contact-making elements having small structural dimensions. It is advantageous, in the case of the rectangular cross-sectional area of the contact-making element, to use a ratio of the side lengths of 1.5 or more. Depending on the structural dimension and the possibility for controlling the exposure of the mask, this has the effect that the cross section of the contact-making elements is often essentially round or elliptical.

One disadvantage is the reduction of the controllability of the critical structural dimension ("critical dimension control") along that direction of extent of the contact-making element with a rectangular cross-section along which the longer side edge of the rectangle cross section runs. The space requirement of the contact-making element is larger along this direction than in the orthogonal direction with respect to said direction, which may lead to a high space requirement of the contact-connected component.

In the case of random logic circuit architecture, in an integrated circuit a sequence of integrated components often occurs, which are arranged with a high degree of spatial asymmetry, and is often not manifested as a recurring arrangement of specific modules or module groups (like for example in the case of a memory circuit). On account of this complex circuit architecture based on an arrangement of many different components, in the case of the design of random logic circuits, a minimum distance of a contact to a polysilicon line, for example, may occur in any arbitrary direction on a substrate in which the circuit is integrated. Therefore, random logic circuits require the control of the critical structural dimension to be sufficiently good in both mutually orthogonal course directions on a substrate. Consequently, in the case of random logic circuits, it is often difficult to configure the arrangement of contact-making elements since, on account of the asymmetrical structure of a random logic circuit, the arrangement of the contact-making elements has to be performed separately for each of its components. Therefore, it is difficult to achieve a small centre-to-centre distance between adjacent components and hence a space-saving layout architecture in the case of random logic circuits. An example which may be mentioned of a circuit having components with which contact is to be made is an arrangement of CMOS transistors whose diffusion regions are contact-connected by means of a contact-making element.

The prior art discloses a series of possibilities for reducing the dimension of a contact-making element and therefore the dimension of the cross-sectional area thereof.

The structural dimension that can be achieved is reduced when using an optical lithography with a reduced light wavelength (for example 193 nm). However, a lithography using such short-wave radiation is complicated and leads to greatly increased production costs.

When using contact-making elements with a rectangular cross section, for example in memory cell circuits, the centre-to-centre distance between adjacent components is increased in the dimension of extent of the rectangular cross section with the longer rectangle side, since the critical structural dimension control is reduced along the long axis. This leads in an undesirable manner to an increased area requirement on the chip.

Furthermore, other methods with which the extent of contact-making elements can be reduced are known, such as the CARL™ method, the RELACS™ method or the resist reflow method.

In the case of the CARL™ method ("chemical amplification of resist lines") described in [1], firstly a thick conventional resist layer is deposited on a substrate and a thin so-called CARL layer is deposited on said resist layer. The CARL layer is patterned, and then the lateral extent of the CARL structures remaining after the patterning method is widened chemically and the lateral extent of the contact holes arranged between adjacent CARL structures is therefore reduced.

In accordance with the RELACS™ method ("resolution enhancement lithography assisted by chemical shrink") described in [2], a conventionally patterned photoresist layer is coated with a RELACS™ layer. By means of a chemical reaction at the interface between the conventionally patterned photoresist layer and the RELACS material applied thereon, the lateral extent of the surface free of the photoresist material is reduced, thereby reducing the lateral dimension of the contact holes.

However, the described chemical methods for forming contact holes with a reduced structural dimension have the disadvantage of high process complexity and high costs. Furthermore, the control of the critical structural dimension is impaired on account of the introduction of additional method steps.

[3] Discloses a method for the configuration of structures of an integrated semiconductor circuit.

[4] Discloses thin-film transistor display apparatuses having coplanar gate and drain lines.

[5] Discloses a method for producing contact holes using an image shortening effect.

The invention is based on the problem of creating a possibility of providing, in an integrated circuit, the contact connection of components with contact-making elements in such a way that the area of the wafer can be utilized better.

The problem is solved by means of a method and an apparatus for the arrangement of contact-making elements of components of an integrated circuit, by means of a computer-readable storage medium, and by means of a program element having the features in accordance with the independent patent claims.

In the case of the invention's method for the arrangement of contact-making elements of components of an integrated circuit, at least one part of at least one component has a larger extent along a first course direction than along a second course direction, which is orthogonal to the first course direction. At least one contact-making element assigned to a component has, in cross section, a larger extent along a third course direction than along a fourth course direction, which is orthogonal to the third course direction. In accordance with the method, the contact-making element is arranged with respect to the assigned component in such a way that the first course direction of the component essentially runs parallel to the third course direction of the contact-making element.

Furthermore, an apparatus for the arrangement of contact-making elements of components of an integrated circuit is provided, having a processor which is set up in such a way that it can carry out a method step in accordance with the method according to the invention.

Moreover, a computer-readable storage medium is provided, in which is stored a program which, if it is executed by a processor, can carry out the method step of the method according to the invention.

Furthermore, a program element for the arrangement of contact-making elements of components of an integrated circuit is provided, which program element, if it is executed by a processor, has a method step in accordance with the method step of the method according to the invention.

Clearly, in the case of the method according to the invention and in the case of the apparatus according to the invention for the arrangement of contact-making elements of components of an integrated circuit, and in the case of the computer-readable storage medium and the program element according to the invention, a geometrical arrangement of electrical contact-making elements of components of an integrated circuit is determined, preferably in computer-aided fashion. In this case, the at least one contact-making element assigned to a component clearly has a longitudinal structure, that is to say that its extent along two mutually orthogonal course directions is of different magnitudes. By way of example, the contact-making element may have an essentially rectangular cross section with rectangle sides of different lengths, an elliptical cross section with principal axes of significantly different lengths, etc.

The component which is assigned to the at least one contact-making element and of which a region, i.e. a component of the component, is to be electrically contact-connected by means of at least one contact-making element likewise has a longitudinal structure. By way of example, the component (or a part thereof) may also be formed in essentially rectangular fashion with rectangle sides of different lengths. By way of example, the component of the component may be a gate line for driving the gate region of a field-effect transistor.

By virtue of the fact that clearly the longer course direction of the contact-making element is arranged parallel to the longer course direction of the contact-connected component, a sufficiently reliable contact connection of the component is made possible and the contact hole extent is simultaneously reduced at least in one dimension. Consequently, the space requirement on a semiconductor chip is kept small, which complies with the trend towards progressive miniaturization of integrated circuits. Clearly, the course directions of the component and of the contact-making element with a structurally large extent are chosen to be parallel to one another, so that the extent of the arrangement is kept small in the orthogonal direction with respect thereto.

These advantages are achieved according to the invention without the occurrence of an increased repetition length of components, that is to say an increased centre-to-centre distance between adjacent components. On the contrary, the reduced extent of the contact-making element brings about a further reduced centre-to-centre distance between adjacent components and therefore enables a continued reduction of the chip size or an effective utilization of the active area available on a chip. In other words, smaller contact holes are provided without this adversely affecting the chip size.

The invention can be realized both by means of a computer program, i.e. a software, and by means of one or more special electrical circuits, i.e. in hardware, or in arbitrary hybrid form, i.e. by means of software components and hardware components. In any event, the software and/or hardware according to the invention fulfils the functionality that a favourable layout of an integrated circuit is determined firstly on the basis of logical objects, i.e. virtually, in such a way that predeterminable criteria (e.g. a predetermined integration density of components) are met. The determination and virtual arrangement of such logical contact-making elements are generally effected in a computer. By means of the control of a production installation which the computer supplies with logical layout information to be realized in practice, the layout is realized in terms of production technology by an integrated circuit with physical contact-making elements being processed on the basis of the logical contact-making elements on a substrate.

In particular, the invention provides a software-controlled selection method which determines the orientation of the longer first course direction of a, for example, rectangular contact-making element with respect to the geometrical arrangement of the component to be contact-connected on the basis of the geometrical surroundings (that is to say adjacent circuit elements or the structure within the component to be contact-connected).

By way of example, the width-to-length ratio in the case of a CMOS transistor of a random logic circuit is often of the order of magnitude of 5 or more. In this case, it may be favourable to orient the long course direction of the, for example, rectangular contact-making element parallel to the main course direction of a gate line (or perpendicular to a connecting axis between the two source/drain regions of the CMOS transistor). This can be realized without an undesirable influencing of adjoining transistors occurring, on account of the width-to-length ratio.

Consequently, the invention provides a simple but effective method which makes it possible to use contact-making elements with a rectangular cross section, in particular in random logic circuits.

Therefore, the invention makes it possible to use contact-making elements with rectangular cross sections in logic circuits, which has not been possible hitherto on account of the problems overcome by the invention.

Furthermore, according to the invention, it is possible to combine the advantages of the use of contact-making elements with a rectangular cross section with the functionality of software-controlled data processing methods, which can be implemented in a simple manner with the system of the invention.

With the invention, on account of the increased integration density or the reduced space requirement, it is possible to achieve integrated circuits on smaller chips, and, as a result, a higher chip yield per wafer is achieved, and the centre-to-centre distance between adjacent components or contact-making elements as a limiting factor for the size of a chip can be reduced. Moreover, a logic circuit architecture with faster signal processing is made possible since the total area of the integrated circuit can be reduced, thereby also enabling shorter interconnects and therefore reduced signal propagation times.

According to the invention, clearly a two-stage method may be carried out for determining an arrangement of rectangular contact-making elements of components of an integrated circuit. In a first method section, a layout for square contact-making elements may be determined for example using a conventional layout calculation method for determining a layout for a semiconductor circuit. To put it another way, a layout for a mask is determined virtually (i.e. under software control), with the boundary condition that the contact-making elements for making contact with the components have a square cross section. The boundary condition that the contact-making elements are to be square may then be abandoned in a second method section. The layout determined in the first method section may then be used as an initial model for a refinement step to be carried out subsequently for the calculation of an improved layout. In this case, clearly the side lengths of the contact-making elements are regarded as free (optimization) parameters, and, consequently, rectangular contact-making elements are also permitted for a layout that is subsequently to be determined. The software-controlled second method section, which represents a main focus of the invention, improves the previously determined layout model on the basis of the criterion that the rectangular contact-making elements are arranged with the longitudinal direction (i.e. in the direction with the larger extent) in that direction in which there is the greater clearance or the greater dimension control. A corresponding layout is then calculated by means of a software, in other words the data of the original design are manipulated. A lithography mask may then be produced on the basis of the layout data thus determined, which are improved compared with the use of square contact-making elements on account of the higher number of degrees of freedom. Said lithography mask may then be used to expose wafers by means of projection lithography and thus to transfer the theoretically determined layout to a semiconductor wafer. This semiconductor wafer then contains an integrated circuit in which components are contact-connected with rectangular contact-making elements. Even though the description just given for illustration purposes was given on the basis of square/rectangular contact-making elements, it lies within the scope of the invention to calculate contact-making elements of any desired geometry for a layout design provided that different extents are permitted for the calculated contact-making elements along two mutually orthogonal directions. Thus, it is possible, by way of example, for contact-making elements with an elliptical cross section to be determined according to the invention from a layout with contact-making elements with a circular cross section.

Preferred developments of the invention emerge from the dependent claims.

In accordance with the method, an essentially rectangular cross section may be used for at least one contact-making element, the third course direction of the contact-making element running parallel to the longer rectangle side, and the fourth course direction of the contact-making element running parallel to the shorter rectangle side.

Even though the use of a contact-making element with a rectangular cross section is particularly advantageous, a contact-making element with a cross section that deviates from a rectangular cross section is also possible. Thus, by way of example, it is possible to use a contact-making element with an elliptical or polygonal cross section.

It is also possible to use a contact-making element with a geometrically irregular or complicated cross section, for example, in order to compensate for mask faults known a priori. By way of example, if it is known that, on account of optical imaging errors, a rectangular desired cross section on the mask plane leads to a physical contact-making element with an elliptical cross section on the semiconductor chip, then this known imaging deviation can be compensated for by providing a contact-making element with a suitably chosen cross section in the mask, so that the physical contact-making element on the surface of the integrated circuit is rectangular, taking account of the distortion.

Furthermore, the contact-making element may be arranged on the basis of the surroundings of the assigned component in the integrated circuit, in particular on the basis of the adjacent components arranged in the surroundings.

The contact-making element may be arranged on the basis of the criterion that the area requirement of the integrated circuit is reduced, which is advantageous with regard to the material consumption, the trend towards miniaturization and the need for circuits with fast signal processing.

Furthermore, the contact-making element may be arranged on the basis of the criterion that the distance between adjacent components is reduced.

The contact-making element is preferably arranged on the basis of the criterion that an undesirable influencing between adjacent components and/or between adjacent contact-making elements of a component is avoided. Avoiding crosstalk between adjacent components may be taken into account as a criterion when determining the geometrical arrangement of the contact-making elements.

The contact-making element may be arranged on the basis of the criterion that the speed, in particular a signal processing speed, of the integrated circuit is increased or maximized.

The lengths of the rectangle sides of the contact-making element with a rectangular cross-sectional area are preferably determined in such a way that the area requirement of the integrated circuit and/or the distance between adjacent components is/are reduced.

In other words, in accordance with the optimization method according to the invention, the arrangement of an integrated component may also be determined in such a way that the dimensions of the rectangle sides of the contact-making element are regarded as variables which can be altered and adapted to the requirements of the integrated circuit.

The integrated circuit may have at least two different types of components. In particular, the integrated circuit may contain a logic circuit or be a logic circuit, in particular a random logic circuit.

In the case of a random logic circuit, complicated and not very regular sequences of different integrated components often occur, so that particular importance is accorded to the targeted arrangement of rectangular contact-making elements in random logic circuits. This is made possible according to the invention without the centre-to-centre distance between adjacent components or adjacent contact-making elements thereby being adversely influenced.

Furthermore, in the case of the method, at least one of the components may be a field-effect transistor, and the contact-making elements may be provided for making contact with the source/drain regions of the at least one field-effect transistor. In accordance with the method, the longer rectangle side of the contact-making element is arranged in a manner essentially running parallel to a course direction of a gate line. The shorter rectangle side of the contact-making element may be arranged in a manner essentially running parallel to the connecting axis of the two source/drain regions.

However, the component may be not only a field-effect transistor (in particular a MOSFET), but rather may be a bipolar transistor, a diode, a memory cell (for example floating gate memory cell), a logic gate, a capacitor, a nonreactive resistor, a coil, etc.

In accordance with the method, furthermore, for each of the components, the geometrical arrangement of the centroid of each of the associated contact-making elements may be determined, and the two side lengths of the rectangular cross section of each of the associated contact-making elements may be determined.

By way of example, firstly a contact-making element with a square cross section may be arranged at a suitable location on a layout design for a component that is subsequently to be formed in an integrated circuit that is subsequently to be formed. At this point in time, the layout generally exists only as a software component, but not realized on a wafer. An additional software module may then distort the contact-making element with a square cross section in the layout to form a rectangular cross section, in which case the side lengths of the then rectangular virtual contact-making element may preferably be chosen such that the long axis is arranged in such a way as to enable a best possible CD control (critical dimension). A wafer with rectangular contact-making elements may then be processed on the basis of such an improved layout.

To summarize, the invention provides a novel contact hole design, in particular for random logic semiconductor circuits.

It should be noted that all configurations which are described with reference to the invention's method for the arrangement of contact-making elements of components of an integrated circuit also apply to the invention's apparatus, the computer-readable storage medium and the program element.

In particular, the invention may be used particularly advantageously in logic circuits.

Exemplary embodiments of the invention are illustrated in the figures and are explained in more detail below.

In the figures:

FIG. 3 shows a second layout view of the circuit to be configured at a different point in time during the invention's arrangement of contact-making elements;

FIG. 4A shows a flow diagram of a method for the arrangement of contact-making elements of components of an integrated circuit in accordance with an exemplary embodiment of the invention;

Figure 1:
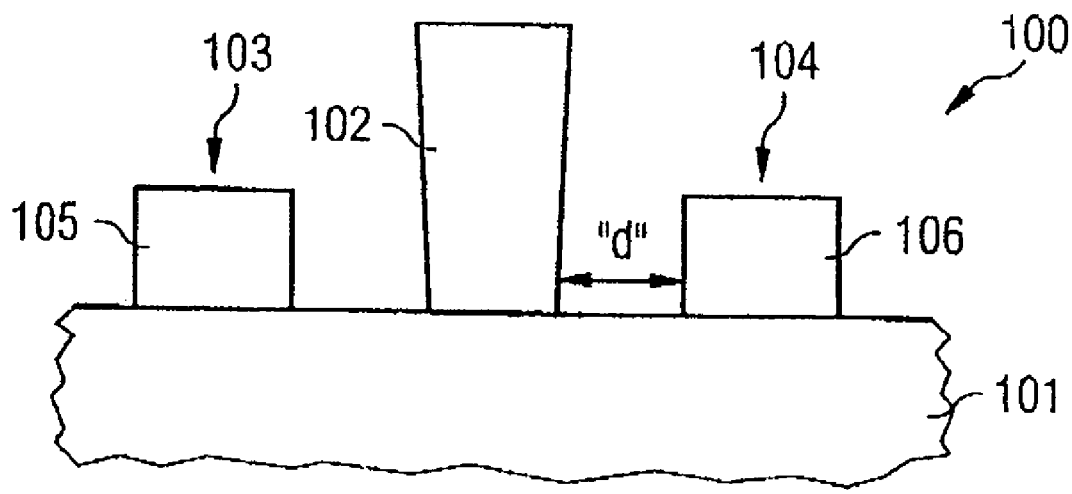
FIG. 1 shows a cross-sectional view of an integrated circuit.

The integrated circuit 100 is described below with reference to FIG. 1.

Said integrated circuit exhibits a silicon substrate 101, on or in which are integrated a first field-effect transistor 103 as first component and a second field-effect transistor 104 as second component. The components of the field-effect transistors 103, 104 are only partly shown in FIG. 1, in particular the gate region 105 and the gate region 106, respectively, of the field-effect transistors 103, 104 are shown. A contact-making element 102 is arranged between the field-effect transistors 103, 104. The contact-making element 102 is arranged at a distance "d" from the gate region 106 of the second field-effect transistor 104, which distance ought not to fall below a critical (minimum) distance. If the contact-making element 102 is arranged defectively (in particular too closely adjacent) with respect to the field-effect transistors 103, 104, then this results in an undesirable interaction between individual components. In particular, it is then not possible to preclude the situation in which integrated components can be erroneously contact-connected by means of the contact-making element 102, which may adversely influence the functionality of the integrated circuit 100. If the distance between adjacent components is chosen to be very large, then valuable surface area of the silicon substrate 101 is lost needlessly. Therefore, critical importance is accorded to the accurately targeted arrangement of the contact-making element in the integrated circuit 100.

A description is given below, with reference to FIG. 2, of a first layout view 200 for an integrated circuit as is obtained at a first point in time during the invention's method for determining an arrangement of contact-making elements in accordance with an exemplary embodiment of the invention.

Figure 2:
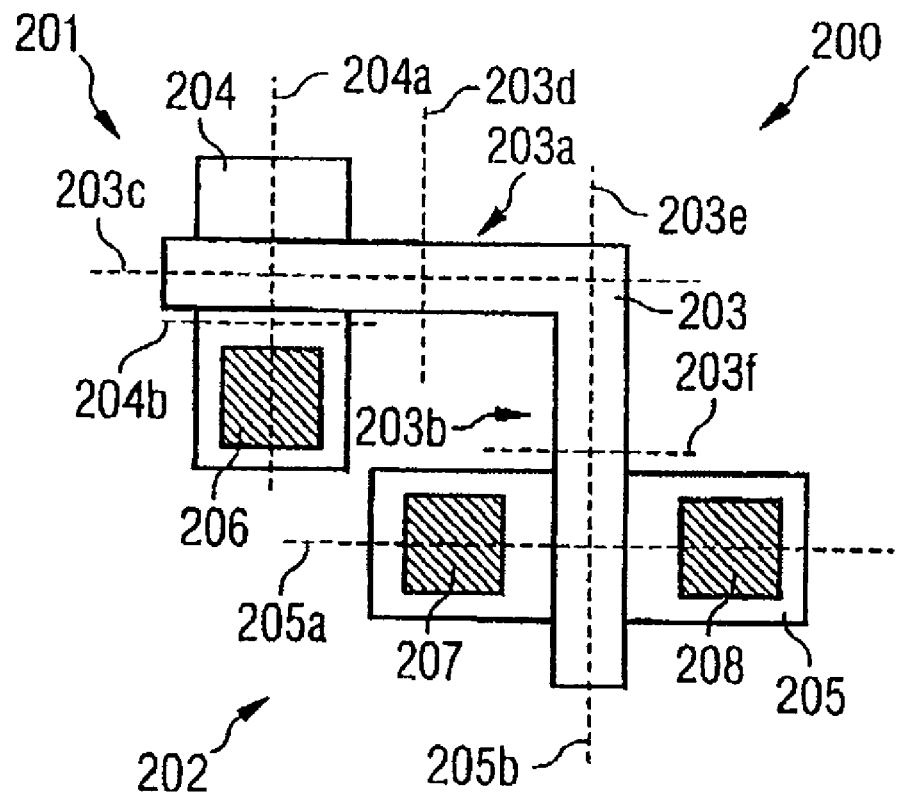
FIG. 2 shows a first layout view of an integrated circuit to be configured at a first point in time during the arrangement of contact-making elements according to the invention.

It should firstly be noted that the layout view 200 shown in FIG. 2 is not actually processed on a semiconductor substrate, but rather represents a layout created by means of a software for creating a layout design for an integrated semiconductor circuit, i.e. represents a logical rather than a physical object.

The layout design of an integrated circuit 200 has a first field-effect transistor 201 and a second field-effect transistor 202, which have a common gate line 203 for making contact with the gate regions of the field-effect transistors 201, 202. In the case of the layout design of an integrated circuit 200 as shown in FIG. 2, the common gate line 203 is provided as an angular (right-angled) element containing a first gate component 203a for controlling the first field-effect transistor 201 and a second gate component 203b for controlling the second field-effect transistor 202, said second gate component being orthogonal to the first gate component 203a. The first gate component 203a extends in the layout design along a first course direction 203c and also along a second course direction 203d orthogonal thereto, the extent thereof being considerably larger in the direction of the first course direction 203c than in the direction of the second course direction 203d. The second gate component 203b extends along a third course direction 203e and also along a fourth course direction 203f orthogonal thereto, the extent thereof being considerably larger in the direction of the third course direction 203e than in the direction of the fourth course direction 203f. Furthermore, an active region 204 is shown diagrammatically for the first field-effect transistor 201, which active region essentially represents the two source/drain regions and the channel region of the field-effect transistor 201. The active region 204 as part of the first field-effect transistor 201 of the layout design of an integrated circuit 200 extends along a first course direction 204a and also along a second course direction 204b orthogonal thereto. As shown in FIG. 2, the active region 204 has a larger extent along the first course direction 204a than along the second course direction 204b. The active region 205 of the second field-effect transistor 202 is shown diagrammatically in FIG. 2, said active region having the two source/drain regions and the channel region. The active region 205 extends along a first course direction 205a and along a second course direction 205b orthogonal thereto. As shown in FIG. 2, the extent of the active region 205 is larger along the first course direction 205a than along the second course direction 205b.

Furthermore, FIG. 2 shows a first square contact-making element 206 for making contact with a source/drain region of the first field-effect transistor 201. Moreover, second and third square contact-making elements 207, 208 for making contact with the source/drain regions (not shown) of the second field-effect transistor 202 are shown.

All the components of the layout design of an integrated circuit 200 (in particular the square contact-making elements 206 to 208) are virtual, i.e. software elements, and not components already formed on a wafer.

The arrangement of the square contact-making elements 206 to 208 which is determined in accordance with a first method stage of the method according to the invention is effected in such a way that the geometrical arrangement of the centroids of the contact-making elements 206 to 208 is determined in such a way that the area requirement of the integrated circuit is sufficiently small, that the distance between adjacent components or adjacent contact-making elements is sufficiently small, that an undesirable influencing between adjacent components or between adjacent contact-making elements is avoided, and that the speed (simulated or calculated on the basis of a theoretical model) of the integrated circuit in accordance with the layout design 200 is sufficiently high.

A boundary condition in the case of the method for calculating the layout design of an integrated circuit 200 is that the contact-making elements 206 to 208 are to have a square cross section.

In a further method step, according to the invention, the layout design of the integrated circuit 200 as shown in FIG. 2 is optimized further since the use of contact-making elements 206 to 208 with a square cross section is in need of improvement. A use of contact-making elements with a rectangular cross section which have side lengths of different lengths is more favourable.

A description is given below, with reference to FIG. 3, of a layout design of an integrated circuit 300 as is obtained at a second point in time during the invention's software-based method for the arrangement of contact-making elements of components of the layout for an integrated circuit 300.

In this second method stage, the square cross section of the virtual contact-making elements 206 to 208 is clearly distorted to form rectangular cross sections in order to further optimize the layout of the integrated circuit. The essential difference between the layout design of an integrated circuit 200 and the layout design of an integrated circuit 300 thus consists in the fact that, in the case of the layout of the circuit arrangement 300, first to third rectangular contact-making elements 301 to 303 are provided instead of the contact-making elements 206 to 208 with a square cross section.

The longitudinal direction of a respective contact-making element 301 to 303 is clearly arranged in the layout 300 in such a way that the greater clearance or the better dimension control is in the direction of the longer extent of a respective contact-making element 301 to 303.

The first rectangular contact-making element 301, which is assigned to the first field-effect transistor 201, has a rectangular cross section and has a larger extent along a third course direction 301a than along a fourth course direction 301b, which is orthogonal to the third course direction 301a. A second square contact-making element 302 assigned to the second field-effect transistor 202 extends along a third course direction 302a and along a fourth course direction 302b orthogonal thereto, the extent of the second rectangular contact-making element 302 being larger along the third course direction 302a than along the fourth course direction 302b. Correspondingly, a third rectangular contact-making element 303, which is also assigned to the second field-effect transistor 302, extends along a third course direction 303a with a larger extent than along a fourth course direction 303b orthogonal thereto.

In accordance with the method according to the invention, the layout design of the integrated circuit 300, in particular the arrangement of the rectangular and non-square contact-making elements 301 to 303, is determined by arranging the contact-making elements 301 to 303 with respect to the respectively assigned components 203a and 203b in such a way that the first course direction 203c of the first gate component 203a runs parallel to the third course direction 301a of the associated contact-making element 301a. Furthermore, the third course direction 203e of the second gate component 203b is arranged such that it runs parallel to the third course directions 302a and 303a of the associated contact-making elements 302, 303. The shorter rectangle side of the respective contact-making element 301 to 303 is also arranged in a manner essentially running parallel to the connecting axis of the two source/drain regions of the respectively assigned field-effect transistor 201 and 202. After the optimized layout design for an integrated circuit 300 in accordance with FIG. 3 has been determined in a computer-aided manner, a lithography mask is created on the basis of this layout 300. Using a projection lithography, a wafer is processed using this mask, real physical contact-making elements with a rectangular cross section then being formed on said wafer.

A flow diagram 440 of a method for the arrangement of contact-making elements of components of an integrated circuit in accordance with an exemplary embodiment of the invention is described below with reference to FIG. 4A.

In a first method step 450, a spatial arrangement of contact-making elements is calculated in a computer-aided manner for an integrated circuit to be formed. This is done using a standard software which, in accordance with the exemplary embodiment described, determines for example the geometrical centroids of the contact-making elements in the circuit to be designed. As an alternative, the standard software may calculate an arrangement of square contact-making elements.

In a second method step 455, as a result of method step 450, a provisional layout is then obtained for the integrated circuit to be configured, which layout also contains a provisional arrangement of square contact-making elements.

In a third method step 460, an improved arrangement of the contact-making elements is calculated in a software-aided manner on the basis of or proceeding from the provisional layout obtained. Method step 460 is the core of the method according to the invention. Clearly, the assumption that the contact-making elements have a square cross section which is made in method step 450 is abandoned in step 460, and a rectangular form of contact-making elements is permitted. The rectangle sides of the contact-making elements are oriented with the longer side in that direction on the circuit layout in which there is the greatest geometrical clearance. Furthermore, in this method step, the dimensions of the rectangle sides may be altered (optimized), e.g. using a fit routine.

In a fourth method step 465, as a result of method step 460, a final layout is then obtained for the integrated circuit to be configured, which final layout also contains a final, i.e. optimized, arrangement of rectangular contact-making elements.

In a fifth method step 470, a lithography mask is produced in accordance with the calculated final layout.

In a sixth method step 475, semiconductor wafers for producing an integrated circuit in accordance with the final layout are then subjected to a projection lithography method, the lithography mask produced in method step 470 being used to form an integrated circuit on a respective wafer.

Figure 4B:
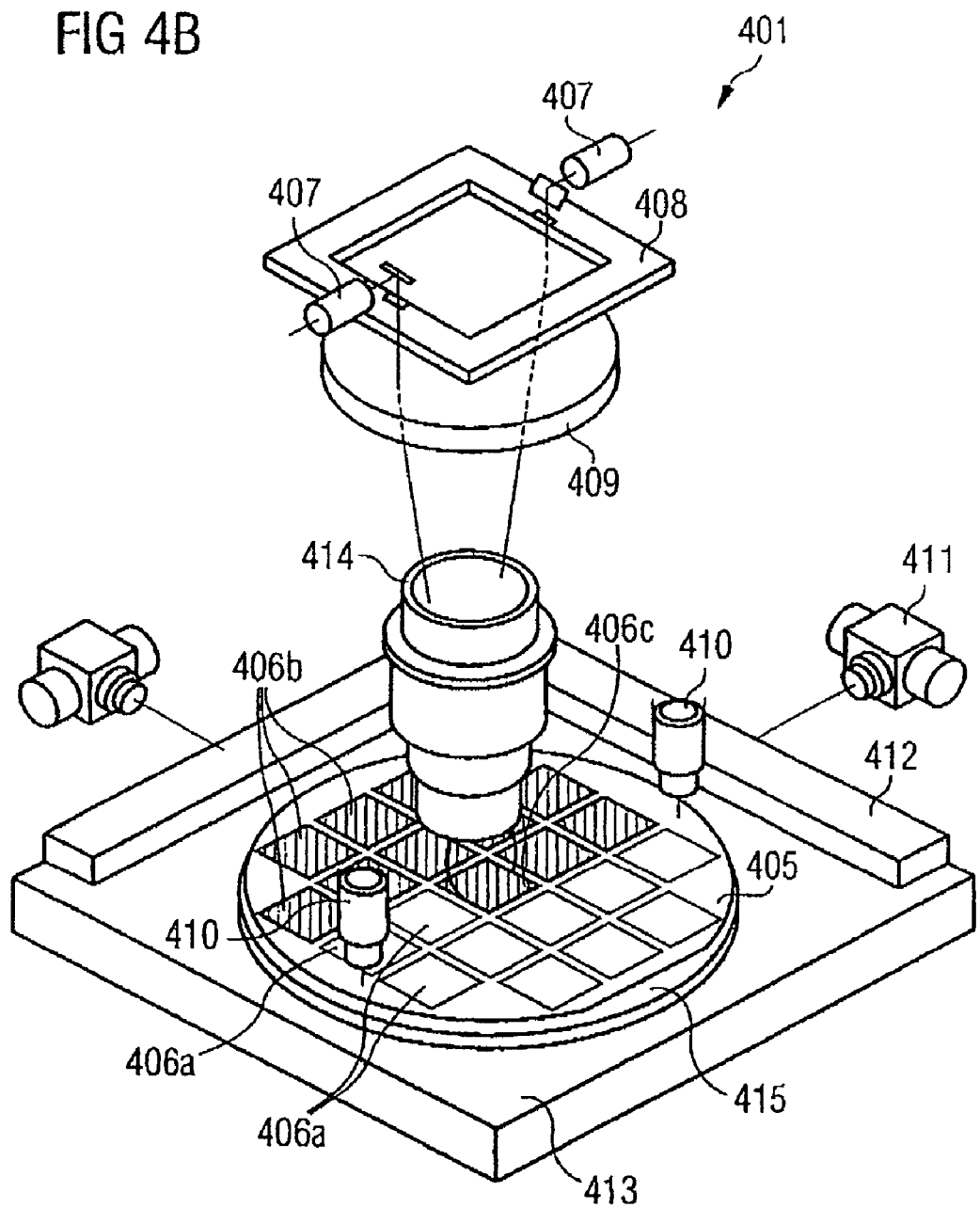
FIG. 4B shows a lithography device for processing wafers in accordance with an arrangement of contact-making elements of components of an integrated circuit, which arrangement is determined according to the invention.

A lithography device 401 for processing wafers in accordance with the final layout of an integrated circuit determined in accordance with FIG. 4A is described below with reference to FIG. 4B.

By means of the lithography device 401, chips 406a, 406b of a silicon wafer 405 are processed in such a way that, on the chips 406a, 406b, an exposure is carried out, in accordance with the mask produced in method step 470 of FIG. 4A, as a partial step for forming an integrated circuit. For this purpose, the silicon wafer 405 is firstly arranged on a carrier element 415, which is in turn arranged on an xy table. Using a prealigning optical arrangement 410 and also an aligning optical arrangement 407, a respective chip to be processed (the chip 406c to be processed in accordance with the scenario of FIG. 4B) is oriented with respect to an exposure system. The exposure system contains a reticle 408 (i.e. the mask produced in method step 470 of FIG. 4A), a lens 409 and a light source (e.g. a laser) not shown, by means of which light can be radiated through the arrangement comprising reticle 408, lens 409 and objective 414 in accordance with a mask with a predetermined patterning pattern onto the chip 406c of the wafer 405 that is respectively to be processed. By means of a scanning mechanism, the system can selectively expose each of the chips 406a, 406b, 406c. The process of selectively moving to a lateral table position is effected with the aid of a laser interferometer 411 and a mirror area 412.

In accordance with the scenario shown in FIG. 4, the chips 406a have already been processed, that is to say exposed in accordance with the mask, whereas the unprocessed chips 406b have not yet been exposed.

It should be noted that before the chips 406a, 406b are exposed, a photoresist layer (not shown) is applied to them, the photoresist material being set up in such a way that it can be removed after exposure by means of an etching method, whereas unexposed photoresist material is protected from removal by means of etching. After exposure, the wafer 405 is therefore subjected to an etching method in order to realize the desired patterning of the chips.

The photolithographic patterning of the chips 406 of the silicon wafer 405 is effected in order to form, on each of the chips 406, an integrated circuit having components with rectangular contact-making elements in accordance with the final layout determined in FIG. 4A.

Physical, that is to say material, contact-making elements are formed on the chips 406a, 406b, 406c of the semiconductor wafer 405 on the basis of the final layout calculated theoretically in method step 465, i.e. on the basis of the logical contact-making element objects.

It should be noted that the formation of the contact-making elements requires, in addition to the lithography device 401, further devices for example for the deposition and etching of photoresist or material for the contact-making elements.

What is claimed is:

1. Method for the arrangement of contact-making elements of components of an integrated circuit, at least one part of at least one component having a larger extent along a first course direction than along a second course direction, which is orthogonal to the first course direction, at least one contact-making element assigned to a component having, in cross section, a larger extent along a third course direction than along a fourth course direction, which is orthogonal to the third course direction, in which the contact-making element is arranged with respect to the assigned component in such a way that the first course direction of the component essentially runs parallel to the third course direction of the contact-making element, firstly a first layout being determined under the assumption of contact-making elements with a square cross section, a second layout with contact-making elements with a rectangular cross section being determined on the basis of the first layout.

2. Method according to claim 1,
in which the contact-making element is furthermore arranged on the basis of the surroundings of the assigned component in the integrated circuit.

3. Method according to claim 1,
in which the contact-making element is arranged on the basis of the criterion that the area requirement of the integrated circuit is reduced.

4. Method according to one of claim 1,
in which the contact-making element is arranged on the basis of the criterion that the distance between adjacent components is reduced.

5. Method according to one of claim 1, in which the contact-making element is arranged on the basis of the criterion that an undesirable influencing between adjacent components and/or between adjacent contact-making elements of a component is avoided.

6. Method according to one of claim 1,
in which the contact-making element is arranged on the basis of the criterion that the speed of the integrated circuit is increased.

7. Method according to one of claim 1,
in which the lengths of the rectangle sides of the contact-making element with a rectangular cross-sectional area are determined in such a way that the area requirement of the integrated circuit and/or the distance between adjacent components is/are reduced.

8. Method according to one of claim 1,
in which the integrated circuit has at least two different types of components.

9. Method according to one of claim 1,
in which the integrated circuit contains a logic circuit or is a logic circuit.

10. Method according to one of claim 1,
in which
at least one of the components is a field-effect transistor;
contact-making elements for making contact with the source/drain regions of the at least one field-effect transistor are provided;

the shorter rectangle side of the contact-making element is arranged in a manner essentially running parallel to the connecting axis of the two source/drain regions.

11. Method according to one of claim 1,
in which
at least one of the components is a field-effect transistor;
contact-making elements for making contact with the source/drain regions of the at least one field-effect transistor are provided;
the longer rectangle side of the contact-making element is arranged in a manner essentially running parallel to a course direction of a gate line.

12. Method according to one of claim 1,
in which, for each of the components,
the geometrical arrangement of the centroid of each of the associated contact-making elements is determined;
the two side lengths of each of the associated contact-making elements with a rectangular cross section are determined.

13. Apparatus for the arrangement of contact-making elements of components of an integrated circuit, at least one part of at least one component having a larger extent along a first course direction than along a second course direction, which is orthogonal to the first course direction, at least one contact-making element assigned to a component having, in cross section, a larger extent along a third course direction than along a fourth course direction, which is orthogonal to the third course direction,
having a processor which is set up in such a way that the following method steps can be carried out:
the contact-making element is arranged with respect to the assigned component in such a way that the first course direction of the component essentially runs parallel to the third course direction of the contact-making element,
firstly a first layout being determined under the assumption of contact-making elements with a square cross section,
a second layout with contact-making elements with a rectangular cross section being determined on the basis of the first layout.

14. Computer-readable storage medium, in which is stored a program for the arrangement of contact-making elements of components of an integrated circuit, at least one part of at least one component having a larger extent along a first course direction than along a second course direction, which is orthogonal to the first course direction, at least one contact-making element assigned to a component having, in cross section, a larger extent along a third course direction than along a fourth course direction, which is orthogonal to the third course direction, which program, if it is executed by a processor, has the following method steps:
the contact-making element is arranged with respect to the assigned component in such a way that the first course direction of the component essentially runs parallel to the third course direction of the contact-making element,
firstly a first layout being determined under the assumption of contact-making elements with a square cross section,
a second layout with contact-making elements with a rectangular cross section being determined on the basis of the first layout.

15. Program element for the arrangement of contact-making elements of components of an integrated circuit, at least one part of at least one component having a larger extent along a first course direction than along a second course direction, which is orthogonal to the first course direction, at least one contact-making element assigned to a component having, in cross section, a larger extent along a third course direction than along a fourth course direction, which is orthogonal to the third course direction, which program element, if it is executed by a processor, has the following method steps:
the contact-making element is arranged with respect to the assigned component in such a way that the first course direction of the component essentially runs parallel to the third course direction of the contact-making element,
firstly a first layout being determined under the assumption of contact-making elements with a square cross section,
a second layout with contact-making elements with a rectangular cross section being determined on the basis of the first layout.

* * * * *